(12) United States Patent
Jo et al.

(10) Patent No.: US 11,917,879 B2
(45) Date of Patent: Feb. 27, 2024

(54) DISPLAY DEVICE

(71) Applicant: SAMSUNG DISPLAY CO., LTD., Yongin-si (KR)

(72) Inventors: Kang Moon Jo, Hwaseong-si (KR); Dong Woo Kim, Yongin-si (KR); Sung Jae Moon, Seongnam-si (KR); Jun Hyun Park, Suwon-si (KR); An Su Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/548,785

(22) Filed: Dec. 13, 2021

(65) Prior Publication Data

US 2022/0165839 A1 May 26, 2022

Related U.S. Application Data

(63) Continuation of application No. 16/596,952, filed on Oct. 9, 2019, now Pat. No. 11,201,204.

(30) Foreign Application Priority Data

Dec. 10, 2018 (KR) .......................... 10-2018-0158345

(51) Int. Cl.
*H10K 59/131* (2023.01)
*H01L 27/12* (2006.01)
(Continued)

(52) U.S. Cl.
CPC ....... *H10K 59/1315* (2023.02); *H10K 50/813* (2023.02); *H10K 59/1213* (2023.02);
(Continued)

(58) Field of Classification Search
CPC .... H01L 27/3276–3279; H10K 59/131; H10K 59/1213; H10K 59/1255; H10K 59/1315; H10K 59/1216
See application file for complete search history.

(56) References Cited

U.S. PATENT DOCUMENTS 11,201,204 B2 * 12/2021 Jo .................. H01L 27/3248
2009/0295772 A1 * 12/2009 Kim ..................... G09G 3/2022
345/76

(Continued)

FOREIGN PATENT DOCUMENTS

KR 10-2018-0024910 3/2018

*Primary Examiner* — Alia Sabur
(74) *Attorney, Agent, or Firm* — F. Chau & Associates, LLC

(57) ABSTRACT

A display device including: a substrate; an active layer disposed on the substrate and including active patterns; a first conductive layer disposed on the active layer; a second conductive layer disposed on the first conductive layer and including a data line; a third conductive layer disposed on the second conductive layer; and a light-emitting element disposed on the third conductive layer, wherein the first conductive layer includes a scan line, a first voltage line, and a second voltage line, the third conductive layer includes a third voltage line connected to the first voltage line and a fourth voltage line connected to the second voltage line, the first voltage line and the second voltage line extend in a first direction, the third voltage line and the fourth voltage line extend in a second direction, and the third voltage line and the fourth voltage line are alternately arranged in the first direction.

10 Claims, 7 Drawing Sheets

(51) Int. Cl.
*H10K 50/813* (2023.01)
*H10K 59/121* (2023.01)
*H10K 59/123* (2023.01)
*H10K 59/124* (2023.01)
*H10K 59/35* (2023.01)

(52) U.S. Cl.
CPC ....... *H10K 59/1216* (2023.02); *H10K 59/123* (2023.02); *H10K 59/124* (2023.02); *H10K 59/35* (2023.02); *H01L 27/124* (2013.01); *H01L 27/1248* (2013.01); *H01L 27/1255* (2013.01)

(56) References Cited

U.S. PATENT DOCUMENTS

| | | |
|---|---|---|
| 2011/0227098 A1 | 9/2011 | Choi |
| 2014/0034923 A1 | 2/2014 | Kim et al. |
| 2016/0260792 A1 | 9/2016 | Kim et al. |
| 2016/0320675 A1* | 11/2016 | Lee .................. G02F 1/136286 |
| 2017/0125506 A1* | 5/2017 | Kim ...................... G09G 3/3225 |
| 2019/0189708 A1* | 6/2019 | Lee ....................... G09G 3/3291 |
| 2020/0185489 A1 | 6/2020 | Jo et al. |

* cited by examiner

DISPLAY DEVICE

CROSS-REFERENCE TO RELATED APPLICATIONS

This application is a continuation of U.S. patent application Ser. No. 16/596,952 filed on Oct. 9, 2019, which claims priority under 35 U.S.C. § 119 to Korean Patent Application No. 10-2018-0158345 filed in the Korean Intellectual Property Office on Dec. 10, 2018, the disclosures of which are incorporated by reference herein in their entireties.

TECHNICAL FIELD

The present invention relates to a display device.

DESCRIPTION OF THE RELATED ART

A display device is a device for displaying an image. Some display devices need a separate light source to display an image while others are self-emissive. For example, a light emitting diode display is a self-light emission display device.

Since the light emitting diode display is self-light emitting, it does not require a separate light source; therefore, thickness and weight thereof may be reduced. Further, the light emitting diode display has characteristics such as low power consumption, high luminance, and high response speed.

In general, the light emitting diode display includes a substrate, a plurality of thin film transistors disposed on the substrate, a plurality of insulating layers disposed between wires configuring the thin film transistor, and a light-emitting element connected to the thin film transistor. The light-emitting element may include an organic light emitting element.

SUMMARY

A display device according to an exemplary embodiment of the present invention includes: a substrate; an active layer disposed on the substrate and including a plurality of active patterns including a semiconductor material; a first conductive layer disposed on the active layer; a second conductive layer disposed on the first conductive layer and including a data line for transmitting a data signal; a third conductive layer disposed on the second conductive layer; and a light-emitting element disposed on the third conductive layer, wherein the first conductive layer includes a scan line for transmitting a scan signal, a first voltage line, and a second voltage line, the third conductive layer includes a third voltage line electrically connected to the first voltage line and a fourth voltage line electrically connected to the second voltage line, the first voltage line and the second voltage line extend in a first direction, the third voltage line and the fourth voltage line extend in a second direction crossing the first direction, and the third voltage line and the fourth voltage line are alternately arranged in the first direction.

The second conductive layer may include a first connecting member electrically connected to the first voltage line, and a second connecting member electrically connected to the second voltage line, the third voltage line may be electrically connected to the first connecting member, and the fourth voltage line may be electrically connected to the second connecting member.

The light-emitting element may include a pixel electrode disposed on the third conductive layer, an emission layer disposed on the pixel electrode, and a common electrode disposed on the emission layer, and a width of the third voltage line in the first direction may be larger than a width of the pixel electrode in the first direction.

A width of a space in the first direction between the third voltage line and the fourth voltage line that are adjacent to each other may be smaller than a width of the third voltage line in the first direction.

The third conductive layer may further include a third connecting member separated from the third voltage line and the fourth voltage line, and the pixel electrode may be electrically connected to the third connecting member.

The third connecting member may be disposed in an opening of the third voltage line.

The first voltage line and the second voltage line may be alternately arranged in the second direction, the scan line may be repeatedly arranged in the second direction, and the first voltage line and the second voltage line may be disposed between two adjacent scan lines.

The first conductive layer may include a driving gate electrode disposed between the scan line and the first voltage line, and the second conductive layer may include a capacitor electrode overlapping the driving gate electrode in a plan view to form a first capacitor.

A lower pattern which is conductive and disposed between the substrate and the active layer may be further included in the display device, the lower pattern may overlap the driving gate electrode in the plan view to form a second capacitor, and the lower pattern may be electrically connected to the capacitor electrode.

The active pattern may include a first active pattern of a first transistor, a second active pattern of a second transistor, and a third active pattern of a third transistor, the driving gate electrode may be electrically connected to a conductive region of the second active pattern, the capacitor electrode may be electrically connected to a conductive region of the first active pattern, and the third active pattern may be electrically connected to the capacitor electrode.

The second conductive layer may further include an initialization voltage line extending in the second direction, and a conductive region of the third active pattern may be electrically connected to the initialization voltage line.

The active layer may further include a transverse initialization voltage line which is conductive and electrically connected to the initialization voltage line, and the transverse initialization voltage line may be connected to the third active pattern and extends in the first direction.

An insulating layer disposed on the third conductive layer may be further included in the display device, the light-emitting element may include a pixel electrode disposed on the third conductive layer, an emission layer disposed on the pixel electrode, a common electrode disposed on the emission layer, and a common layer disposed between the pixel electrode and the common electrode, the common layer and the insulating layer may have a contact hole disposed on the fourth voltage line, and the common electrode may be electrically connected to the fourth voltage line through the contact hole.

A fourth conductive layer disposed on the third conductive layer may be further included in the display device, the third conductive layer may further include a connecting member that is separated from the third voltage line and the fourth voltage line, the fourth conductive layer may include a first contact member in contact with the fourth voltage line and a second contact member in contact with the connecting member, the common electrode may be electrically connected to the fourth voltage line through the first contact member, and the pixel electrode may be electrically connected to the connecting member through the second contact member.

A display device according to an exemplary embodiment of the present invention includes: a pixel group including a first pixel, a second pixel, and a third pixel that are arranged in a first direction and adjacent to each other; a scan line, a first voltage line, and a second voltage line extending in the first direction; data lines respectively corresponding to the first pixel, the second pixel, and the third pixel and extending in a second direction crossing the first direction; a third voltage line extending in the second direction and electrically connected to the first voltage line; a fourth voltage line extending in the second direction and electrically connected to the second voltage line; and a light-emitting element including a common electrode electrically connected to the fourth voltage line.

The third voltage line and the fourth voltage line may be alternately arranged in the first direction.

The light-emitting element may further include an emission layer, and a pixel electrode facing the common electrode, and a width of the third voltage line in the first direction may be larger than a width of the pixel electrode corresponding to the second pixel in the first direction.

A display device according to an exemplary embodiment of the present invention includes: a first scan line and a second scan line; a plurality of data lines and initialization voltage lines crossing the first and second scan lines; a first voltage line and a second voltage line crossing the plurality of data lines; a first transistor including a first gate electrode disposed between the first scan line and the first voltage line, and a first active pattern crossing the first gate electrode and electrically connected to the first voltage line; a second transistor including a second active pattern electrically connected to the first gate electrode, and a second gate electrode included in the first scan line; a third transistor including a third active pattern electrically connected to the first active pattern, and a third gate electrode included in the second scan line; and a light-emitting element including a pixel electrode electrically connected to the first transistor and the third transistor, an emission layer, and a common electrode, wherein the common electrode is electrically connected to the second voltage line.

A third voltage line and a fourth voltage line crossing the first and second scan lines may be further included in the display device, the third voltage line may be electrically connected to the first voltage line and disposed in a different layer from the first voltage line, and the fourth voltage line may be electrically connected to the second voltage line and disposed in a different layer from the second voltage line.

The third voltage line may overlap the first active pattern, the second active pattern, and the third active pattern in a plan view.

BRIEF DESCRIPTION OF THE DRAWINGS

FIG. 4 shows both of a configuration shown in FIG. 2 and a configuration shown in FIG. 3.

DETAILED DESCRIPTION OF THE EMBODIMENTS

Figure 1:
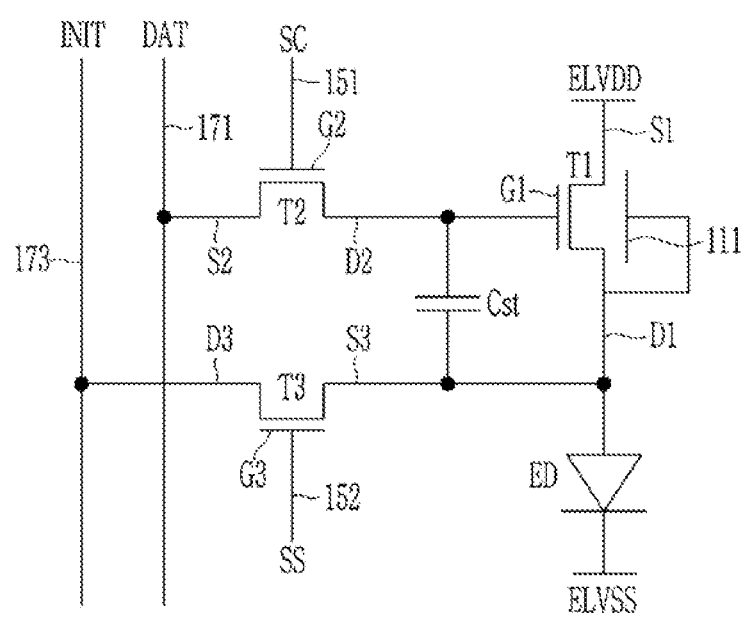
FIG. 1 is an equivalent circuit diagram of one pixel of a display device according to an exemplary embodiment of the present invention.

Hereinafter, exemplary embodiments of the present invention will be described more fully with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

Throughout this specification, a plan view may mean a view observing a surface parallel to two directions (e.g., an x direction and a y direction) crossing each other, and a cross-sectional view may mean a view observing a surface cut in a direction (e.g., a z direction) perpendicular to the surface parallel to the x direction and the y direction. In addition, to overlap two constituent elements may mean that two constituent elements are overlapped in the z direction (e.g., a direction perpendicular to an upper surface of the substrate).

FIG. 1 is an equivalent circuit diagram for one pixel of a display device according to an exemplary embodiment of the present invention.

Referring to FIG. 1, the display device according to an exemplary embodiment of the present invention includes a plurality of pixels, and each pixel includes a plurality of transistors T1, T2, and T3, a capacitor Cst, and at least one light emitting diode (LED) ED. In the present exemplary embodiment, an example in which one pixel includes one light emitting diode (LED) ED is described.

The plurality of transistors T1, T2, and T3 may include a first transistor T1, a second transistor T2, and a third transistor T3. The source and drain electrodes described below refer to the two electrodes located on either side of the channel of each of the transistors T1, T2, and T3, and the two terms may be interchanged.

A gate electrode G1 of the first transistor T1 is connected to a first terminal of the capacitor Cst, a source electrode S1 of the first transistor T1 is connected to a driving voltage line for transmitting a driving voltage ELVDD, and a drain electrode D1 of the first transistor T1 is connected to an anode of the light emitting diode (LED) ED and a second terminal of the capacitor Cst. The driving voltage ELVDD may be a predetermined voltage. The first transistor T1 receives a data voltage DAT according to a switching operation of the second transistor T2, and may supply a driving current to the light emitting diode (LED) ED depending on the voltage stored in the capacitor Cst.

A gate electrode G2 of the second transistor T2 is connected to a first scan line 151 for transmitting a first scan signal SC, a source electrode S2 of the second transistor T2 is connected to a data line 171 for transmitting the data voltage DAT or a reference voltage, and a drain electrode D2 of the second transistor T2 is connected to the first terminal of the capacitor Cst and the gate electrode G1 of the first transistor T1. The second transistor T2 may be turned on according to the first scan signal SC to transfer the reference voltage or the data voltage DAT to the gate electrode G1 of the first transistor T1 and the first terminal of the capacitor Cst.

A gate electrode G3 of the third transistor T3 is connected to a second scan line 152 for transmitting a second scan signal SS, a source electrode S3 of the third transistor T3 is connected to the second terminal of the capacitor Cst, the drain electrode D1 of the first transistor T1, and the anode of the light emitting diode (LED) ED, and a drain electrode D3 of the third transistor T3 is connected to an initialization voltage line 173 for transmitting an initialization voltage INIT. The initialization voltage line 173 may sense the voltage of the anode of the light emitting diode (LED) ED connected to the source electrode S3 of the third transistor T3 in addition to transmitting the initialization voltage INIT in a driving period. Herein, the initialization voltage line 173 may be referred to as a sensing line, and the third transistor T3 may be referred to as a sensing transistor.

The third transistor T3 is turned on according to the second scan signal SS, and transfers the initialization voltage INIT to the anode of the light emitting diode (LED) ED and the second terminal of and the capacitor Cst to initialize the voltage of the anode of the light emitting diode (LED) ED and to sense the voltage of the anode of the light emitting diode (LED) ED.

The first terminal of the capacitor Cst is connected to the gate electrode G1 of the first transistor T1 and the second terminal of the capacitor Cst is connected to the source electrode S3 of the third transistor T3 and the anode of the light emitting diode (LED) ED.

The cathode of the light emitting diode (LED) ED is connected to a common voltage line for transmitting a common voltage ELVSS. The common voltage ELVSS may be a voltage of a different magnitude than the driving voltage ELVDD. The common voltage ELVSS may be a predetermined voltage. The light emitting diode (LED) ED may emit light according to the driving current formed by the first transistor T1.

Figure 2:
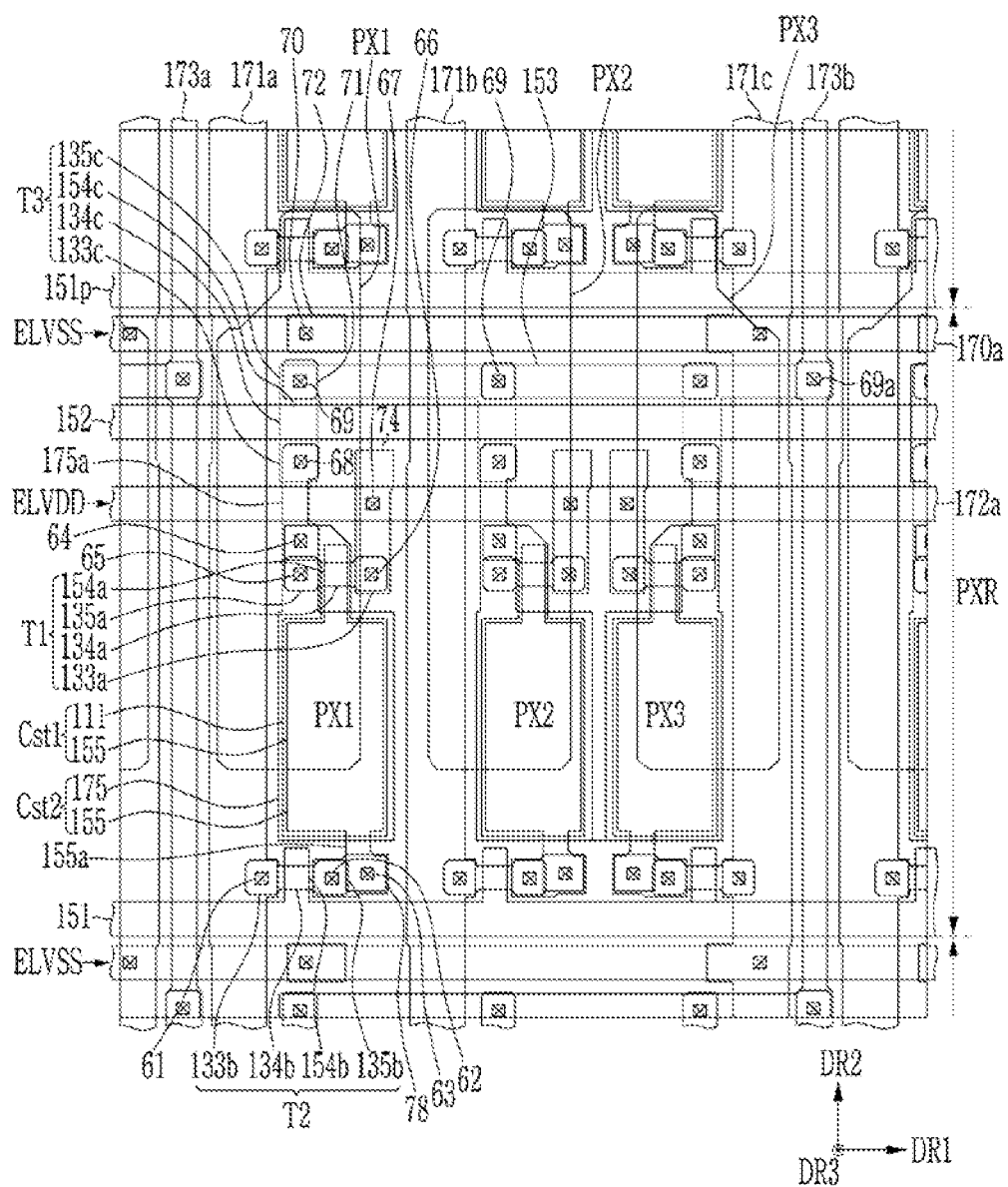
FIG. 2, FIG. 3 and FIG. 4 are layout views of a plurality of pixels of a display device according to an exemplary embodiment of the present invention, where
Figure 3:
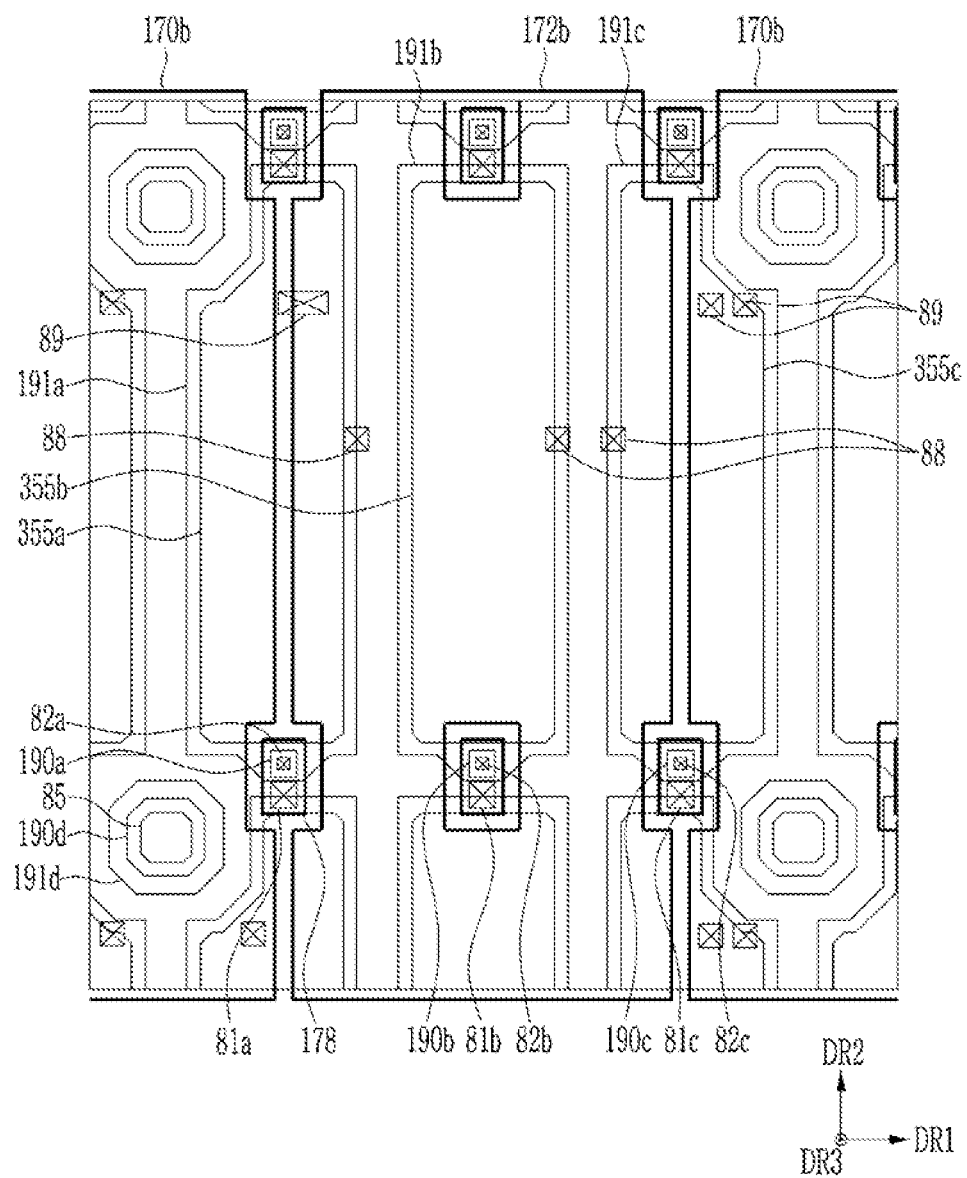
Figure 4:
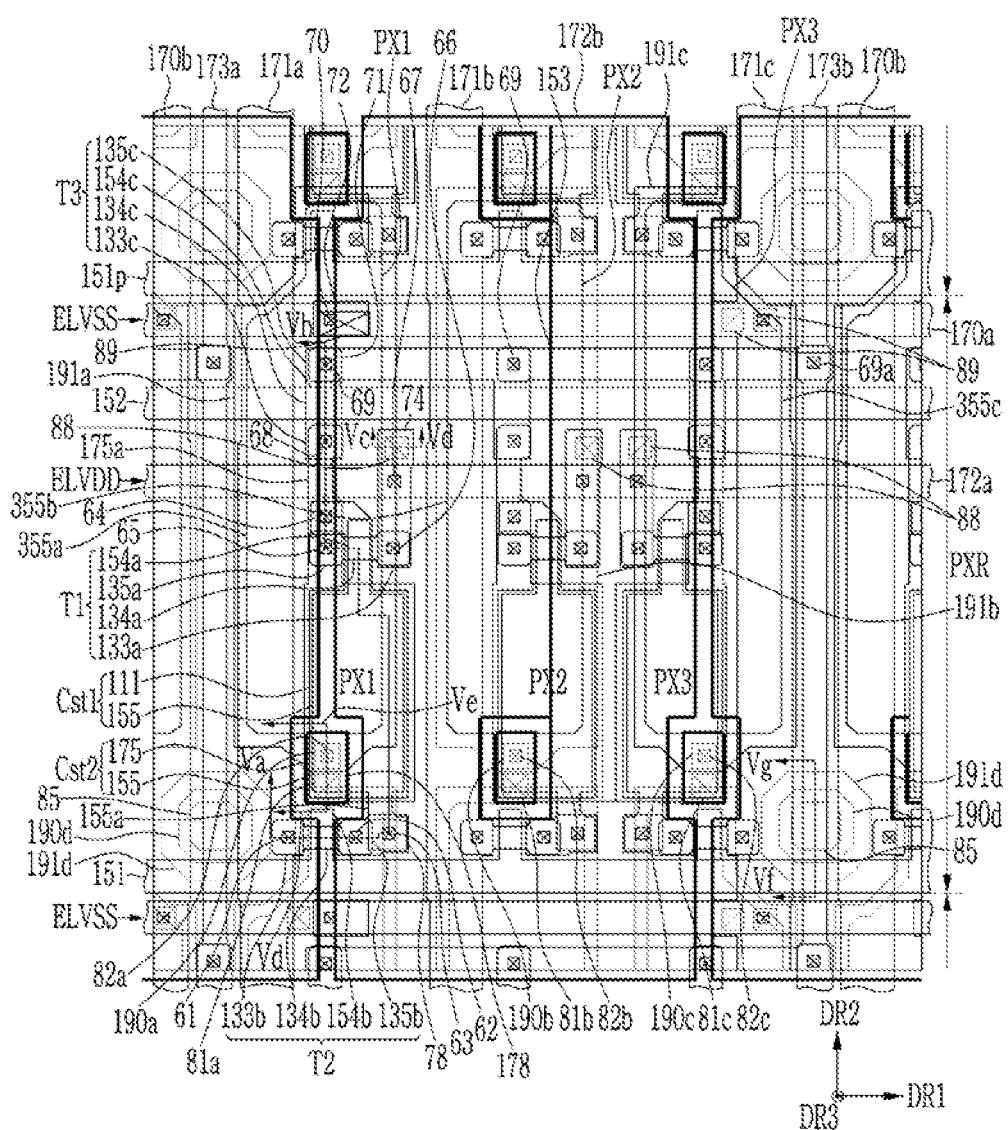
Figure 5:
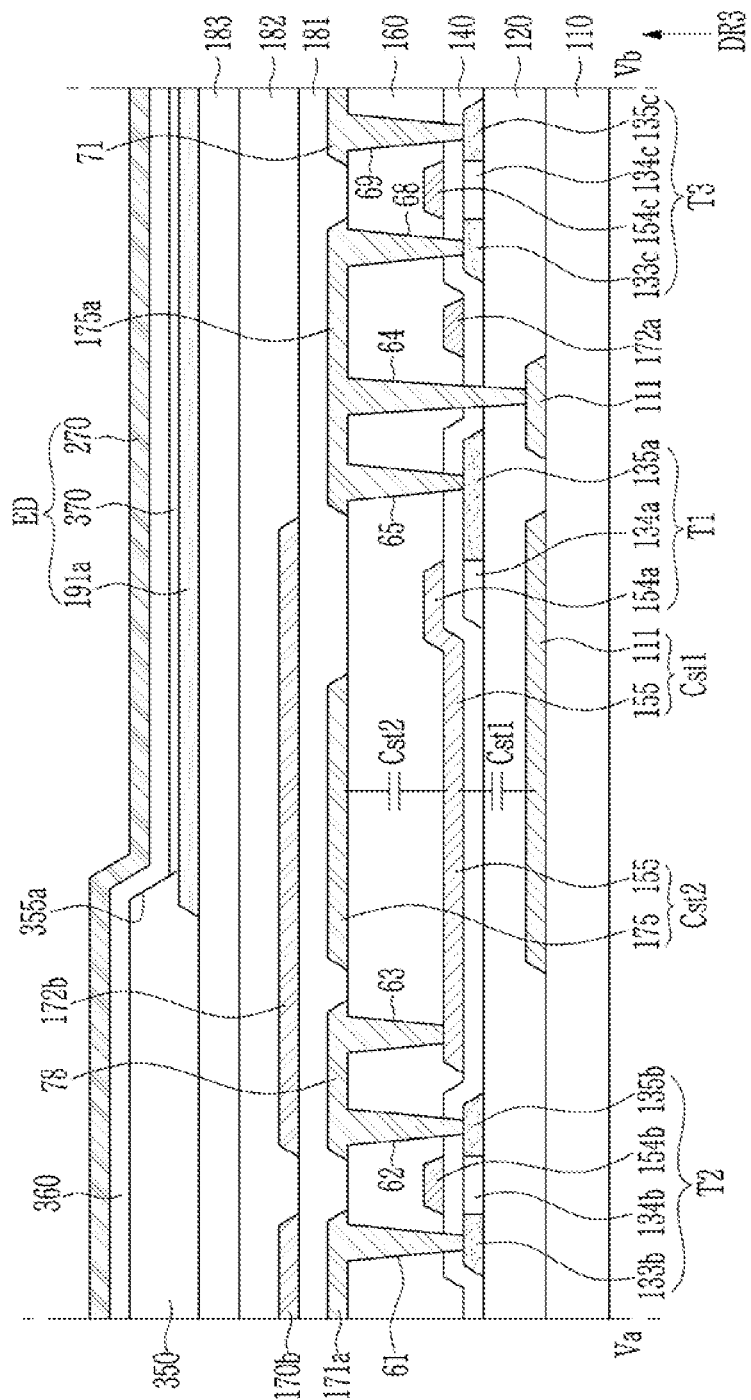
FIG. 5 is a cross-sectional view of the display device shown in FIG. 4 taken along a line Va-Vb.
Figure 6:
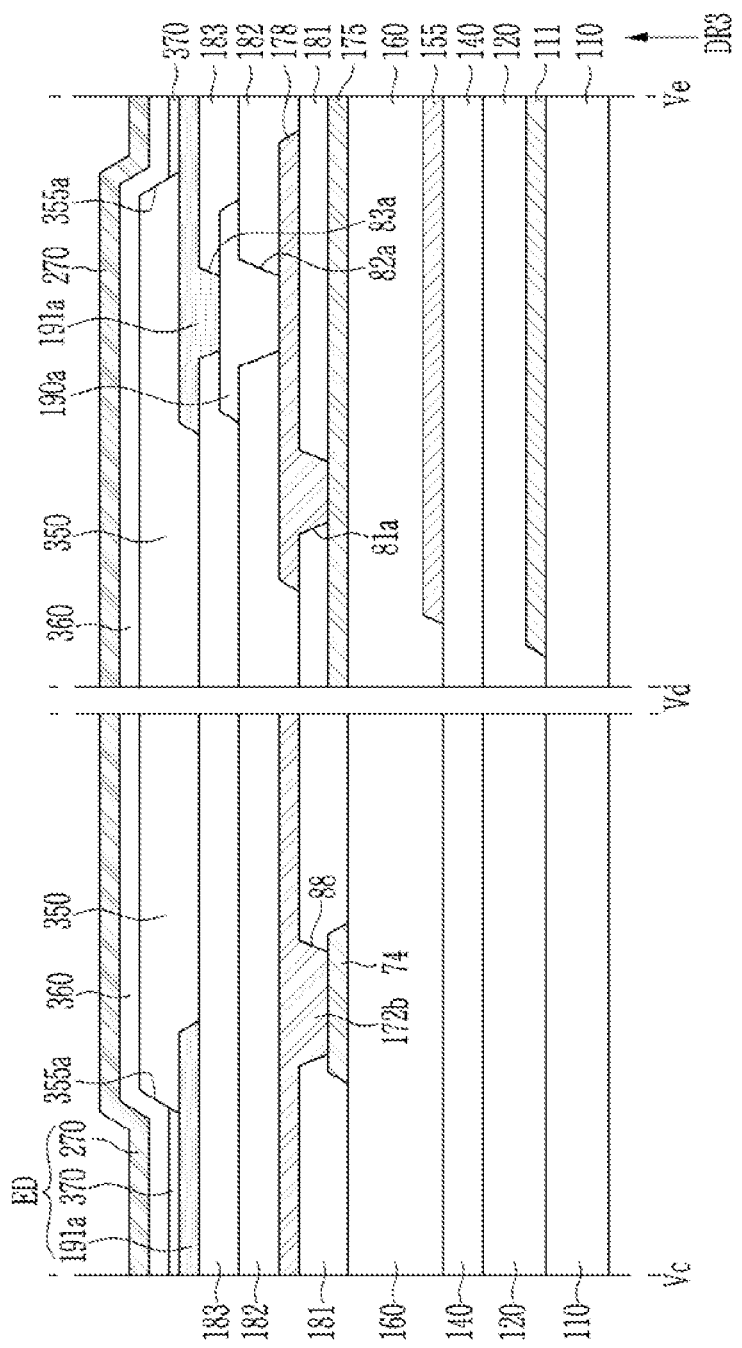
FIG. 6 is a cross-sectional view of the display device shown in FIG. 4 taken along lines Vc-Vd and Vd-Ve.
Figure 7:
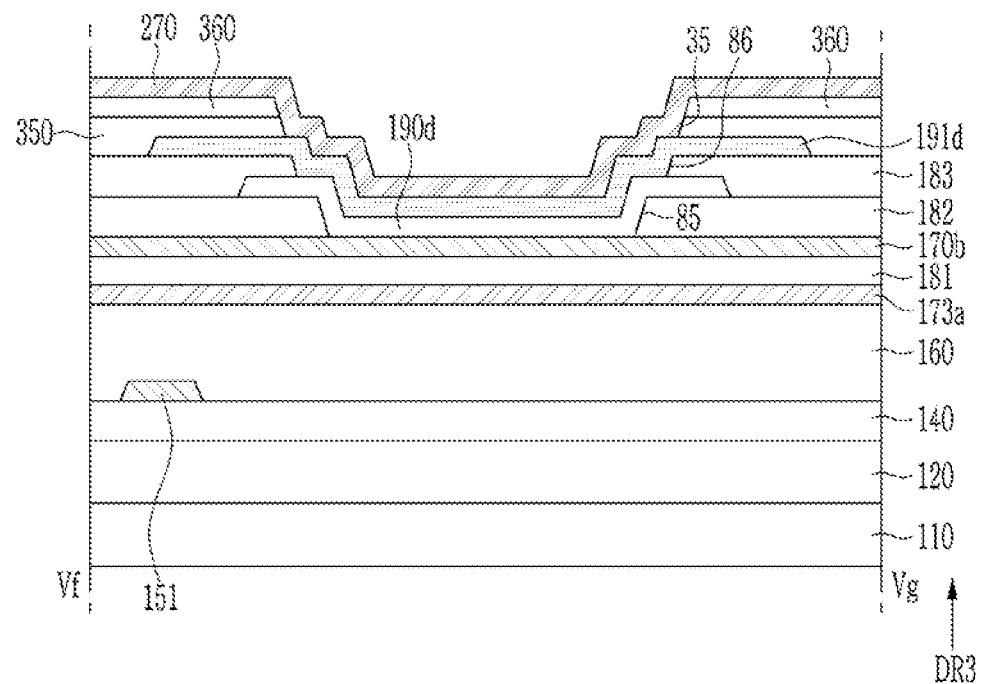
FIG. 7 is a cross-sectional view of the display device shown in FIG. 4 taken along a line Vf-Vg.

FIG. 2, FIG. 3 and FIG. 4 are layout views of a plurality of pixels of a display device according to an exemplary embodiment of the present invention, where FIG. 4 shows both of a configuration shown in FIG. 2 and a configuration shown in FIG. 3, FIG. 5 is a cross-sectional view of the display device shown in FIG. 4 taken along a line Va-Vb, FIG. 6 is a cross-sectional view of the display device shown in FIG. 4 taken along lines Vc-Vd and Vd-Ve, and FIG. 7 is a cross-sectional view of the display device shown in FIG. 4 taken along a line Vf-Vg.

A plurality of pixels PX1, PX2, and PX3 included in one pixel group shown in FIG. 2, FIG. 3 and FIG. 4 may be repeatedly arranged in the first direction DR1 and the second direction DR2. For the sake of convenience, most reference numerals are shown only for the constituent elements of one pixel PX1, but the same reference numerals and corresponding description for the corresponding constituent elements of the other two pixels PX2 and PX3 are equally applicable.

In a plan view, the two pixels PX1 and PX2 have substantially the same structure, and the pixel PX3 may have a structure in which the structure of the pixel PX1 or the pixel PX2 is symmetrical on its right and left sides, but it is not limited thereto.

Hereinafter, the cross-sectional structure of the display device according to an exemplary embodiment of the present invention is described, and layout forms of each constituent element are described.

Referring to FIG. 5, FIG. 6 and FIG. 7, the display device according to an exemplary embodiment of the present invention may include a substrate 110. The substrate 110 may include an insulating material such as glass, plastic, or the like, and may have flexibility.

Referring to FIG. 2, FIG. 4, FIG. 5, FIG. 6 and FIG. 7, a plurality of lower patterns 111 as a first conductive layer may be disposed on the substrate 110. The lower pattern 111 is conductive, and may include a semiconductor material with various metals or conductive characteristics.

A buffer layer 120, which is an insulating layer, may be disposed on the lower pattern 111. In other words, the lower pattern 111 may be disposed between the substrate 110 and the buffer layer 120.

An active layer including a plurality of active patterns may be disposed on the buffer layer 120. In other words, the lower pattern 111 may be disposed between the substrate 110 and the active layer.

The active pattern of each of the pixels PX1, PX2, and PX3 may include a channel region 134a, 134b, and 134c forming each channel of the transistors T1, T2, and T3, and conductive regions connected thereto. The conductive region of the active pattern may include source regions 133a, 133b, and 133c and drain regions 135a, 135b, and 135c of each of the transistors T1, T2, and T3.

The active pattern may further include a transverse initialization voltage line 153 that may transmit the initialization voltage INIT. Each transverse initialization voltage line 153 is disposed corresponding to the plurality of pixels PX1, PX2, and PX3 included in one pixel group repeated in the first direction DR1 and the second direction DR2. For example, one transverse initialization voltage line 153 may be provided for each pixel group in a plan view.

The transverse initialization voltage line 153 may be connected to the drain region 135c of the active pattern of the plurality of third transistors T3 included in the plurality of pixels PX1, PX2, and PX3. The transverse initialization voltage line 153 may be included in the conductive region of the active pattern and may have conductivity. In a plan view, the transverse initialization voltage line 153 may extend lengthwise in the first direction DR1.

The direction in which the active pattern of the third transistor T3 extends may be different from the direction in which the transverse initialization voltage line 153 extends. For example, the active pattern of the third transistor T3 and the transverse initialization voltage line 153 may meet to be perpendicular to each other.

The active layer may include a semiconductor material such as amorphous silicon, polysilicon, an oxide semiconductor, etc.

A first insulating layer 140 may be disposed on the active layer. The first insulating layer 140 may be patterned so as not to overlap the conductive region of the active pattern.

A second conductive layer may be disposed on the first insulating layer 140.

The second conductive layer may include the first scan line (151 and 151p) for transmitting the first scan signal SC, the second scan line 152 for transmitting the second scan signal SS, a driving gate electrode 155, a second gate electrode 154b, a third gate electrode 154c, a transverse driving voltage line 172a for transmitting the driving voltage ELVDD, and a transverse common voltage line 170a for transmitting the common voltage ELVSS. In the circuit diagram shown in FIG. 1 as above-described, the gate electrode G1, the gate electrode G2, and the gate electrode G3 may respectively correspond to the driving gate electrode 155, the second gate electrode 154b, and the third gate electrode 154c.

In a plan view, the first and second scan lines (151 and 151p) and 152, the transverse driving voltage line 172a, and the transverse common voltage line 170a may be extended in the first direction DR1 and may be formed in parallel so as to not meet each other.

In FIG. 2 and FIG. 4, the first scan line 151p is the first scan line of a previous stage to that of the first scan line 151. For example, the first scan line 151p may transmit the first scan signal SC of the previous stage of the first scan signal SC transmitted by the first scan line 151. One pixel row PXR may be located between the first scan lines 151 and 151p. In other words, the region that starts from the first scan line 151 and reaches the first scan line 151p may be one pixel row PXR. This pixel row PXR may be repeatedly arranged in the second direction DR2.

The driving gate electrode 155 may be disposed between the first scan line 151 and the second scan line 152 in a plan view. For example, the driving gate electrode 155 may be disposed between the first scan line 151 and the transverse driving voltage line 172a, and the second scan line 152 may be disposed between the transverse driving voltage line 172a and the transverse common voltage line 170a. The transverse initialization voltage line 153 may be disposed between the second scan line 152 and the transverse common voltage line 170a in a plan view.

One transverse driving voltage line 172a and one transverse common voltage line 170a may be disposed in each pixel row PXR. In other words, the pitch of the transverse common voltage line 170a repeatedly arranged in the second direction DR2 and the transverse driving voltage line 172a repeatedly arranged in the second direction DR2 is equal to the pitch of the pixels PX1, PX2, and PX3 in the second direction DR2.

The second gate electrode 154b may be connected to the first scan line 151, and for example, may have a shape protruded on the first scan line 151. The third gate electrode 154c may be included in the second scan line 152.

The driving gate electrode 155 disposed in each pixel PX1, PX2, and PX3 may include an extending part 155a protruded downward and extending substantially in the second direction DR2, and a first gate electrode 154a protruded upward and extending substantially in the second direction DR2.

The first gate electrode 154a may cross the active pattern of the first transistor T1, and may overlap the channel region 134a of the active pattern of the first transistor T1. The second gate electrode 154b may cross the active pattern of the second transistor T2, and may overlap the channel region 134b of the active pattern of the second transistor T2. The second scan line 152 including the third gate electrode 154c may cross the active pattern of the third transistor T3, and may overlap the channel region 134c of the active pattern of the third transistor T3.

A second insulating layer 160 may be disposed on the second conductive layer. The second insulating layer 160, and the first insulating layer 140, or the second insulating layer 160, the first insulating layer 140, and the buffer layer 120 may include a plurality of contact holes 61, 62, 63, 64, 65, 66, 67, 68, 69, 69a, and 70.

A third conductive layer may be disposed on the second insulating layer 160. The third conductive layer may include a plurality of data lines 171a, 171b, and 171c, initialization voltage lines 173a and 173b, a capacitor electrode 175, and a plurality of connecting members 71, 72, 74, and 78, which correspond to each pixel PX1, PX2, and PX3 and are disposed adjacent thereto.

The data lines 171a, 171b, and 171c and the initialization voltage lines 173a and 173b may extend in the second direction DR2, thereby crossing the first scan lines 151 and 151p, the second scan line 152, the transverse driving voltage line 172a, and the transverse common voltage line 170a.

The initialization voltage lines 173a and 173b are disposed at the left and right sides of a region where a plurality of pixels PX1, PX2, and PX3 of a pixel group and a plurality of data lines 171a, 171b, and 171c connected to the pixel group are disposed. In other words, one of initialization voltage lines 173a and 173b may be disassociated for each of a plurality of pixels PX1, PX2, and PX3 of one pixel group. For example, the initialization voltage line 173a in FIG. 2 may not be connected to the plurality of pixels PX1, PX2 and PX3 to the right of the initialization voltage line 173a. In the exemplary embodiment shown in FIG. 2 and FIG. 4, the initialization voltage line 173b disposed on the right side of the plurality of pixels PX1, PX2, and PX3 may be connected to the transverse initialization voltage line 153 connected to the plurality of pixels PX1, PX2, and PX3.

Two driving gate electrodes 155 included in two pixels PX2 and PX3 may be disposed between the data lines 171b and 171c corresponding to the two pixels PX2 and PX3 of the three pixels PX1, PX2, and PX3 of one pixel group.

Each of the data lines 171a, 171b, and 171c is electrically connected to the source region 133b of the active pattern of the second transistor T2 through the contact hole 61 of the first insulating layer 140 and the second insulating layer 160.

Each of the initialization voltage lines 173a and 173b is electrically connected to the transverse initialization voltage line 153 of the active layer through the contact hole 69a of the first insulating layer 140 and the second insulating layer 160. Accordingly, the transverse initialization voltage line 153 may transmit the initialization voltage INIT along the initialization voltage lines 173a and 173b. Thus, even if the initialization voltage lines 173a and 173b are formed one by one for each of the three pixels PX1, PX2, and PX3, the initialization voltage INIT may be transmitted to all of the three pixels PX1, PX2, and PX3 through the transverse initialization voltage line 153.

One capacitor electrode 175 may be disposed at each pixel PX1, PX2, and PX3. The capacitor electrode 175 may overlap most of the driving gate electrode 155 with respect to the second insulating layer 160 therebetween to form the capacitor Cst2.

The capacitor electrode 175 may include a connecting part 175a protruding upwardly. The connecting part 175a of the capacitor electrode 175 may be electrically connected to the drain region 135a of the active pattern of the first transistor T1 through the contact hole 65 of the first insulating layer 140 and the second insulating layer 160. The connecting part 175a of the capacitor electrode 175 may extend upward to be electrically connected to the source region 133c of the active pattern of the third transistor T3 through the contact hole 68 of the first insulating layer 140 and the second insulating layer 160. In addition, the connecting part 175a of the capacitor electrode 175 may be electrically connected to the lower pattern 111 through the contact hole 64 of the buffer layer 120, the first insulating layer 140, and the second insulating layer 160.

The lower pattern 111 may be disposed one by one for each pixel PX1, PX2, and PX3. In a plan view, the lower pattern 111 may include a part overlapping most of the driving gate electrode 155 and the capacitor electrode 175. The driving gate electrode 155 may overlap most of the lower pattern 111 with the buffer layer 120 and the first insulating layer 140 therebetween to form the capacitor Cst1.

The lower pattern 111 and the capacitor electrode 175 that are electrically connected to each other may transmit the same voltage as each other. In addition, two capacitors Cst1 and Cst2 formed by overlapping the driving gate electrode 155 and the lower pattern 111 and both sides of the capacitor electrode 175 have the same function as each other. Therefore, sufficient capacitance of the capacitor Cst may be ensured. Thus, a display quality defect such as crosstalk caused by a fluctuation of the voltage of the driving gate electrode 155 of the first transistor T1 due to signal coupling may be prevented.

The connecting member 71 may be electrically connected to the transverse initialization voltage line 153 through the contact hole 69 of the first insulating layer 140 and the second insulating layer 160.

The connecting member 72 may be electrically connected to the transverse common voltage line 170a through the contact hole 70 of the first insulating layer 140 and the second insulating layer 160.

The connecting member 74 may be extended lengthwise in the second direction DR2. The connecting member 74 may be electrically connected to the source region 133a of the active pattern of the first transistor T1 through the contact hole 66 of the first insulating layer 140 and the second insulating layer 160 in each pixel PX1, PX2, and PX3. In addition, the connecting member 74 may be electrically connected to the transverse driving voltage line 172a through the contact hole 67 of the second insulating layer 160. Accordingly, the source region 133a of the active pattern of the first transistor T1 may be electrically connected to the transverse driving voltage line 172a to receive the driving voltage ELVDD.

The connecting member 78 may be electrically connected to the drain region 135b of the active pattern of the second transistor T2 through the contact hole 62 of the first insulating layer 140 and the second insulating layer 160 in each pixel PX1, PX2, and PX3. In addition, the connecting member 78 may be electrically connected to the extending part 155a of the driving gate electrode 155 through the contact hole 63 of the second insulating layer 160. Thus, the drain region 135b of the active pattern of the second transistor T2 and the driving gate electrode 155 may be electrically connected to each other.

The first transistor T1 includes the channel region 134a, the source region 133a, the drain region 135a, and the first gate electrode 154a. The source region 133a of the first transistor T1 may receive the driving voltage ELVDD from the transverse driving voltage line 172a through the connecting member 74.

The lower pattern 111 of the first transistor T1 overlaps the channel region 134a and is positioned between the channel region 134a of the first transistor T1 and the substrate 110 to prevent external light from reaching the channel region 134a, thereby reducing a leakage current and characteristic deterioration of the first transistor T1.

The lower pattern 111 is electrically connected to the drain region 135a of the first transistor T1 through the connecting part 175a of the capacitor electrode 175. Since the lower pattern 111 is electrically connected to the drain region 135a and overlaps the channel region 134a, a current change rate in a saturation region of a voltage-current characteristic graph of the first transistor T1 decreases such that a range of a region where the output current of the first transistor T1 is constant may be widened. Therefore, even if there is a change in a source-drain voltage (Vds) of the first transistor T1, the output current of the first transistor T1 is kept constant, thereby improving its output saturation characteristic. Thus, a luminance deviation between the pixels PX1, PX2 and PX3 depending on the output current of the first transistor T1 is reduced, thereby improving image quality.

The second transistor T2 includes the channel region 134b, the source region 133b, the drain region 135b, and the second gate electrode 154b. The source region 133b of the second transistor T2 may be electrically connected to the data lines 171a, 171b, and 171c, thereby receiving the data voltage DAT or the reference voltage. The drain region 135b of the second transistor T2 may be electrically connected to the first gate electrode 154a of the first transistor T1 through the driving gate electrode 155.

The third transistor T3 includes the channel region 134c, the source region 133c, the drain region 135c, and the third gate electrode 154c. The drain region 135c of the third transistor T3 may receive an initialization voltage INIT from the transverse initialization voltage line 153.

A third insulating layer 181 may be disposed on the second insulating layer 160 and the third conductive layer. Referring to FIG. 3, FIG. 4, FIG. 5, FIG. 6 and FIG. 7, the third insulating layer 181 may include a plurality of contact holes 81a, 81b, 81c, 88, and 89.

A fourth conductive layer may be disposed on the third insulating layer 181. The fourth conductive layer may include a driving voltage line 172b, a common voltage line 170b, and a connecting member 178.

Each of the driving voltage line 172b and the common voltage line 170b is extended in the second direction DR2, and the driving voltage line 172b and the common voltage line 170b may be alternately arranged in the first direction DR1.

Since a signal line or a voltage line disposed on the fourth conductive layer and extending in the second direction DR2 only includes the driving voltage line 172b and the common voltage line 170b, for example, other signal lines do not exist, there may be great freedom in the line width of the driving voltage line 172b and the common voltage line 170b.

For example, the width in the first direction DR1 of each of the driving voltage line 172b and the common voltage line 170b may be quite large compared with the width in the first direction DR1 of the signal line disposed in another conductive layer, for example, the data lines 171a, 171b, and 171c, the initialization voltage lines 173a and 173b, etc.

For example, the width of the driving voltage line 172b along the first direction DR1 may be measured continuously starting from the approximate middle of the pixel PX1, and passing through the pixel PX2 to the approximate middle of the pixel PX3. In other words, the width in the first direction DR1 of the driving voltage line 172b may be greater than the width in the first direction DR1 of one pixel PX2, such that the driving voltage line 172b may overlap the entire pixel PX2.

The width of the common voltage line 170b along the first direction DR1 may be measured continuously from the approximate middle of one pixel PX3 of one pixel group to the approximate middle of the directly neighboring pixel PX1 of the neighboring pixel group. In a plan view, the common voltage line 170b may overlap the initialization voltage lines 173a and 173b.

Accordingly, the voltage drop of the common voltage ELVSS and the driving voltage ELVDD is greatly reduced, thereby preventing image quality drop due to a non-uniform voltage.

The width in the first direction DR1 of the driving voltage line 172b may be greater than the width in the first direction DR1 of the common voltage line 170b. In addition, the width in the first direction DR1 of the space between the driving voltage line 172b and the common voltage line 170b neighboring each other may be smaller than the width in the first direction DR1 of the driving voltage line 172b or the width in the first direction DR1 of the common voltage line 170b.

The driving voltage line 172b may be electrically connected to the connecting member 74 of the third conductive layer through the contact hole 88 of the third insulating layer 181. Accordingly, the transverse driving voltage line 172a and the driving voltage line 172b may transmit the driving voltage ELVDD together. Thus, the driving voltage ELVDD is transmitted in a mesh formation in the first direction DR1 and the second direction DR2 throughout the entire display device. Therefore, it is possible to prevent a voltage drop depending on a position of the driving voltage ELVDD. For example, the limitation on the line width of the driving voltage line 172b extending in the second direction DR2 is greatly reduced such that a large line width is possible. Therefore, the wire resistance of the driving voltage line 172b may be greatly reduced and the voltage drop of the driving voltage ELVDD may be greatly reduced. Consequently, the display quality of an image may be improved.

The common voltage line 170b may be electrically connected to the connecting member 72 of the third conductive layer through the contact hole 89 of the third insulating layer 181. Accordingly, the transverse common voltage line 170a and the common voltage line 170b may transmit the common voltage ELVSS together. Thus, the common voltage ELVSS is transmitted in the mesh formation in the first direction DR1 and the second direction DR2 throughout the entire display device. Therefore, it is possible to prevent a voltage drop depending on a position of the common voltage ELVSS. For example, the limitation on the line width of the common voltage line 170b extending in the second direction DR2 is greatly reduced, such that the wire resistance of the common voltage line 170b may be greatly reduced and the voltage drop of the common voltage ELVSS may be greatly reduced. Consequently, the display quality of an image may be improved.

The connecting member 178 may be located in a space between the driving voltage line 172b and the common voltage line 170b neighboring each other, and is spaced apart from the driving voltage line 172b and the common voltage line 170b. A plurality of openings may be formed in an inner region of the driving voltage line 172b, and an island-like connecting member 178 may be formed in the opening of the driving voltage line 172b to be spaced apart from the driving voltage line 172b.

The connecting member 178 may be electrically connected to the capacitor electrode 175 of the third conductive layer through the contact hole 81a, 81b or 81c. Accordingly, the connecting member 178 may be electrically connected to the drain region 135a of the active pattern of the first transistor T1 through the capacitor electrode 175.

At least one among the first conductive layer, the second conductive layer, the third conductive layer, and the fourth conductive layer may include at least one among metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), alloys thereof, etc. Each of the first conductive layer, the second conductive layer, and the third conductive layer may include a single layer or multiple layers.

A fourth insulating layer 182 may be disposed on the third insulating layer 181 and the fourth conductive layer. The fourth insulating layer 182 may include a plurality of contact holes 82a, 82b, 82c, and 85.

A fifth conductive layer may be disposed on the fourth insulating layer 182. The fifth conductive layer may include a plurality of contact members 190a, 190b, 190c, and 190d. Each contact member 190a, 190b, and 190c may be disposed in each pixel PX1, PX2, and PX3 and overlap the connecting member 178 in a plan view. Each of the contact members 190a, 190b, and 190c may be in contact with the connecting member 178 of the fourth conductive layer through the contact holes 82a, 82b, and 82c to be electrically connected to the connecting member 178.

The contact members 190d may overlap the common voltage line 170b of the fourth conductive layer and be in contact with the common voltage line 170b through the contact hole 85 to be electrically connected to the common voltage line 170b.

Each of the contact members 190a, 190b, 190c, and 190d improves the adherence of the fourth conductive layer and an overlying conductive layer, which are in contact with each other, and prevents oxidation of the fourth conductive layer. Particularly, when the fourth conductive layer contains copper, oxidation may be prevented. To accomplish this, the fifth conductive layer may include a conductive material capable of preventing corrosion of the fourth conductive layer and capping it to prevent corrosion. For example, the fifth conductive layer may include a conductive material such as a metal oxide such as ITO or IZO. The fifth conductive layer may be omitted.

A fifth insulating layer 183 may be disposed on the fourth insulating layer 182 and the fifth conductive layer. Referring to FIG. 6 and FIG. 7, the fifth insulating layer 183 may include contact holes 83a disposed on the contact members 190a, 190b, and 190c and a contact hole 86 disposed on the contact member 190d.

At least one among the buffer layer 120, the first insulating layer 140, the second insulating layer 160, the third insulating layer 181, the fourth insulating layer 182, and the fifth insulating layer 183 may include an inorganic insulating material such as a silicon nitride (SiNx), a silicon oxide (SiOx), a silicon oxynitride (SiON), and/or an organic insulating material. The fifth insulating layer 183 may include the inorganic insulating material and/or the organic insulating material such as a polyimide, an acryl-based polymer, a siloxane-based polymer, or the like, and may have a substantially flat upper surface.

A pixel electrode layer including a plurality of pixel electrodes 191a, 191b, and 191c and a contact member 191d as a sixth conductive layer is disposed on the fifth insulating layer 183.

As shown in FIG. 2 to FIG. 4, each pixel electrode 191a, 191b, and 191c may be disposed corresponding to each pixel PX1, PX2, and PX3. The planar size and shape of the pixel electrodes 191a, 191b, and 191c disposed in the neighboring pixels PX1, PX2, and PX3 of one pixel group may be different or similar. For example, the pixel electrode 191a of the pixel PX1 and the pixel electrode 191c of the pixel PX3 may have a right/left symmetrical shape and may be a rectangle having one chamfered corner. The pixel electrode 191b of pixel PX2 may be approximately a rectangle. The pixel PX1 represents red, the pixel PX2 represents green, and the pixel PX3 represents blue, but are not limited thereto.

The width in the first direction DR1 of the driving voltage line 172b may be greater than the width in the first direction DR1 of the pixel electrode 191b disposed at one pixel PX2, and may overlap the entire pixel electrode 191b in a plan view.

Each pixel electrode 191a, 191b, and 191c may be in contact with each contact member 190a, 190b, and 190c through the contact hole 83a to be electrically connected thereto, and may be electrically connected to the connecting member 178 and the capacitor electrode 175 through the contact members 190a, 190b, and 190c. Thus, each pixel electrode 191a, 191b, and 191c may be electrically connected to the drain region 135a of the first transistor T1 to receive the voltage from the first transistor T1.

The contact member 191d may be in contact with the contact members 190d disposed in the fifth conductive layer to be electrically connected thereto through contact holes 86.

The pixel electrode layer may comprise a semipermeable conductive material or a reflective conductive material.

A sixth insulating layer 350 may be disposed on the pixel electrode layer and the fifth insulating layer 183. Referring to FIG. 3, FIG. 4, FIG. 5, FIG. 6 and FIG. 7, the sixth insulating layer 350 may have openings 355a, 355b, and 355c disposed in each pixel electrode 191a, 191b, and 191c. The sixth insulating layer 350 may include an organic insulating material such as a polyacryl-based resin, a polyimide-based resin, or the like.

An emission layer 370 and a common layer 360 may be disposed on the sixth insulating layer 350 and the pixel electrode layer.

The emission layer 370 may include portions disposed in the openings 355a, 355b, and 355c of the sixth insulating layer 350. The emission layer 370 may include an organic luminescent material or an inorganic luminescent material.

The common layer 360 may include a hole injection layer, a hole transport layer, an electron injection layer, and an electron transport layer. The common layer 360 may also be disposed on the sixth insulating layer 350 as well as in the openings 355a, 355b, and 355c. The common layer 360 may include an organic material. In FIG. 5, FIG. 6 and FIG. 7, the common layer 360 is disposed on the emission layer 370 with the pixel electrodes 191a, 191b, and 191c therebelow, however the present invention is not limited thereto, and the common layer 360 may include a portion disposed between the emission layer 370 and the pixel electrodes 191a, 191b, and 191c. For example, the hole injection layer and the hole transport layer may be disposed between the emission layer 370 and the pixel electrodes 191a, 191b, and 191c, and the electron transport layer and the electron injection layer may be disposed between the emission layer 370 and a common electrode 270.

Referring to FIG. 7, the sixth insulating layer 350 and the common layer 360 may include a contact hole 35 disposed on the contact member 191d.

The common electrode 270 may disposed on the common layer 360. The common electrode 270 may be formed continuously over a plurality of the pixels PX1, PX2, and PX3. The common electrode 270 is in contact with the contact member 191d via the contact holes 35 to be electrically connected to the common voltage line 170b through the contact members 190d to receive the common voltage ELVSS.

The common electrode 270 may include a transparent conductive material.

Each pixel electrode (191a, 191b, and 191c), the emission layer 370, the common layer 360, and the common electrode 270 in each pixel PX1, PX2, and PX3 together form the light emitting diode (LED) ED. For example, one of the pixel electrode (191a, 191b, and 191c) and the common electrode 270 becomes a cathode, while the other of the pixel electrodes (191a, 191b, and 191c) becomes an anode. In the previous example, the pixel electrodes 191a, 191b, and 191c are the anode.

Exemplary embodiments of the present invention improve display quality by largely reducing a voltage drop of a voltage line connected to a pixel included in a display device.

While this invention has been particularly shown and described with reference to exemplary embodiments thereof, it is to be understood by those of ordinary skill in the art that various modifications may be made thereto without departing from the spirit and scope of the present invention as defined by the appended claims.

What is claimed is:

1. A display device, comprising:
a substrate;
a lower conductive pattern disposed on the substrate;
an active layer disposed on the substrate and including a plurality of active patterns including a semiconductor material;
a first conductive layer disposed on the active layer, the first conductive layer including a first gate electrode;
a second conductive layer disposed on the active layer, the second conductive layer including a first connecting electrode;
a third conductive layer disposed on the second conductive layer, the third conductive layer including a second connecting electrode;
a light-emitting layer disposed on the third conductive layer; and
a common electrode disposed on the light-emitting layer, wherein
the first gate electrode overlaps the lower conductive pattern to form a first capacitor,
the common electrode is electrically connected to the second connecting electrode, and
the second connecting electrode is electrically connected to the first connecting electrode, and
the first connecting electrode, the second connecting electrode, and the common electrode transmit a first voltage, the display device further comprising
a first voltage line transmitting the first voltage,
wherein a contact member, the second connecting electrode and the common electrode are sequentially stacked to extend across a contact hole on the first voltage line.

2. The display device of claim 1, further comprising:
a scan line extending in a first direction; and
wherein the first voltage line extends in a second direction crossing the first direction.

3. The display device of claim 2, wherein
the third conductive layer further includes a pixel electrode separated from the second connecting electrode, and
the light-emitting layer is disposed between the pixel electrode and the common electrode.

4. The display device of claim 3, further comprising:
a first transistor comprising the first gate electrode, a source region and a drain region,
wherein the pixel electrode is electrically connected to the drain region of the first transistor.

5. The display device of claim 4, wherein
the second conductive layer further includes a capacitor electrode, and
the capacitor electrode overlaps the first gate electrode to form a second capacitor.

6. The display device of claim 5, wherein
the capacitor electrode is electrically connected to the drain region of the first transistor.

7. The display device of claim 5, further comprising:
a plurality of data lines extending in the second direction.

8. The display device of claim 5, wherein
the active pattern includes a first active pattern of the first transistor, a second active pattern of a second transistor, and a third active pattern of a third transistor,
the first gate electrode is electrically connected to a conductive region of the second active pattern,
the capacitor electrode is electrically connected to a conductive region of the first active pattern, and
the third active pattern is electrically connected to the capacitor electrode.

9. The display device of claim 8, further comprising:
an initialization voltage line extending in the second direction, and
a conductive region of the third active pattern is electrically connected to the initialization voltage line.

10. A display device, comprising:
a substrate;
an active layer disposed on the substrate and including a plurality of active patterns including a semiconductor material;
a first conductive layer disposed on the active layer;
a second conductive layer disposed on the first conductive layer;
a third conductive layer disposed on the second conductive layer; and
a light-emitting element disposed on the third conductive layer, the light-emitting element including a common electrode,
wherein
the first conductive layer includes a scan line for transmitting a scan signal, and a first voltage line,
the second conductive layer includes a first conductor electrically connected to the first voltage line,
the third conductive layer includes a second conductor electrically connected to the first conductor,
the first voltage line extends in a first direction, and
the common electrode is electrically connected to the second conductor,
wherein a contact member, the second conductor and the common electrode are sequentially stacked to extend across a contact hole on the first voltage line.

* * * * *